(12) United States Patent
Lehnert et al.

(10) Patent No.: US 10,431,504 B2
(45) Date of Patent: Oct. 1, 2019

(54) METHOD OF MANUFACTURING SEMICONDUCTOR DEVICES BY BONDING A SEMICONDUCTOR DISK ON A BASE SUBSTRATE, COMPOSITE WAFER AND SEMICONDUCTOR DEVICE

(71) Applicant: Infineon Technologies Austria AG, Villach (AT)

(72) Inventors: Wolfgang Lehnert, Lintach (DE); Rudolf Berger, Regensburg (DE); Albert Birner, Regensburg (DE); Helmut Brech, Lappersdorf (DE); Oliver Häberlen, St. Magdalen (AT); Guenther Ruhl, Regensburg (DE); Roland Rupp, Lauf (DE)

(73) Assignee: Infineon Technologies Austria AG, Villach (AT)

( * ) Notice: Subject to any disclaimer, the term of this patent is extended or adjusted under 35 U.S.C. 154(b) by 173 days.

(21) Appl. No.: 15/052,953

(22) Filed: Feb. 25, 2016

(65) Prior Publication Data
US 2016/0260699 A1    Sep. 8, 2016

(30) Foreign Application Priority Data
Mar. 6, 2015   (DE) .......... 10 2015 103 323

(51) Int. Cl.
| H01L 27/02 | (2006.01) |
| H01L 29/16 | (2006.01) |
| H01L 21/8258 | (2006.01) |
| H01L 21/683 | (2006.01) |
| H01L 21/20 | (2006.01) |

(Continued)

(52) U.S. Cl.
CPC ...... *H01L 21/8258* (2013.01); *H01L 21/2007* (2013.01); *H01L 21/6835* (2013.01); *H01L 27/0694* (2013.01); *H01L 29/7783* (2013.01); *H01L 23/481* (2013.01); *H01L 27/085* (2013.01); *H01L 29/0843* (2013.01); *H01L 29/1608* (2013.01); *H01L 29/2003* (2013.01); *H01L 29/78* (2013.01); *H01L 33/0079* (2013.01); *H01L 2221/6835* (2013.01);

(Continued)

(58) Field of Classification Search
CPC .......... H01L 2924/00; H01L 21/76254; H01L 21/2007; H01L 33/0079; H01L 21/76251
USPC ............... 438/458, 455, 406; 257/E21.568, 257/E21.567
See application file for complete search history.

(56) References Cited

U.S. PATENT DOCUMENTS 6,391,799 B1    5/2002  Di Cioccio
9,209,596 B1 *  12/2015  McLaurin .......... H01L 29/2003

(Continued)

FOREIGN PATENT DOCUMENTS

| CN | 103180495 A | 6/2013 |
| DE | 102014118336 A1 | 6/2015 |
| WO | 2014060817 A1 | 4/2014 |

*Primary Examiner* — Jonathan Han
(74) *Attorney, Agent, or Firm* — Murphy, Bilak & Homiller, PLLC

(57) ABSTRACT

A semiconductor disk of a first crystalline material, which has a first lattice system, is bonded on a process surface of a base substrate, wherein a bonding layer is formed between the semiconductor disk and the base substrate. A second semiconductor layer of a second crystalline material with a second, different lattice system is formed by epitaxy on a first semiconductor layer formed from the semiconductor disk.

12 Claims, 12 Drawing Sheets

(51) Int. Cl.
  *H01L 29/778* (2006.01)
  *H01L 27/06* (2006.01)
  *H01L 29/20* (2006.01)
  *H01L 33/00* (2010.01)
  *H01L 29/08* (2006.01)
  *H01L 27/085* (2006.01)
  *H01L 23/48* (2006.01)
  *H01L 29/78* (2006.01)

(52) U.S. Cl.
  CPC ............... *H01L 2221/68327* (2013.01); *H01L 2221/68381* (2013.01)

(56) References Cited

U.S. PATENT DOCUMENTS

| | | |
|---|---|---|
| 9,219,049 B2 | 12/2015 | Berger et al. |
| 2007/0069225 A1 | 3/2007 | Krames et al. |
| 2010/0176490 A1* | 7/2010 | Letertre ............ H01L 21/02367 257/615 |
| 2010/0301347 A1 | 12/2010 | Chung et al. |
| 2011/0278644 A1 | 11/2011 | Gao et al. |
| 2012/0083098 A1* | 4/2012 | Berger ............... H01L 21/02115 438/458 |
| 2013/0075868 A1 | 3/2013 | Sadaka et al. |
| 2013/0306990 A1 | 11/2013 | Saxler |
| 2013/0320404 A1* | 12/2013 | Usenko ................ H01L 29/267 257/200 |
| 2014/0203408 A1* | 7/2014 | Takada ................ H01L 21/306 257/618 |
| 2014/0220764 A1* | 8/2014 | Bayram ............ H01L 21/76251 438/458 |
| 2015/0084074 A1* | 3/2015 | Bayram ................ C30B 25/18 257/94 |
| 2015/0171045 A1* | 6/2015 | Berger ............... H01L 21/02002 257/744 |

* cited by examiner

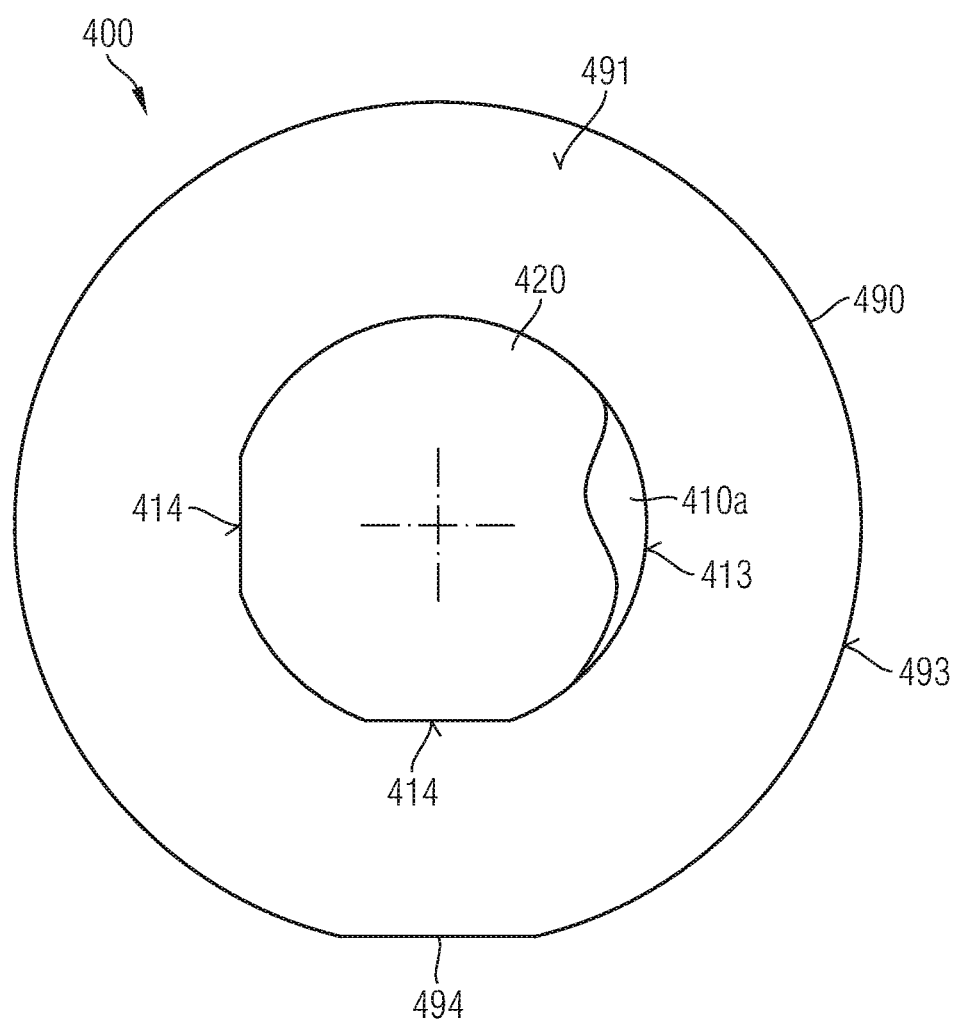

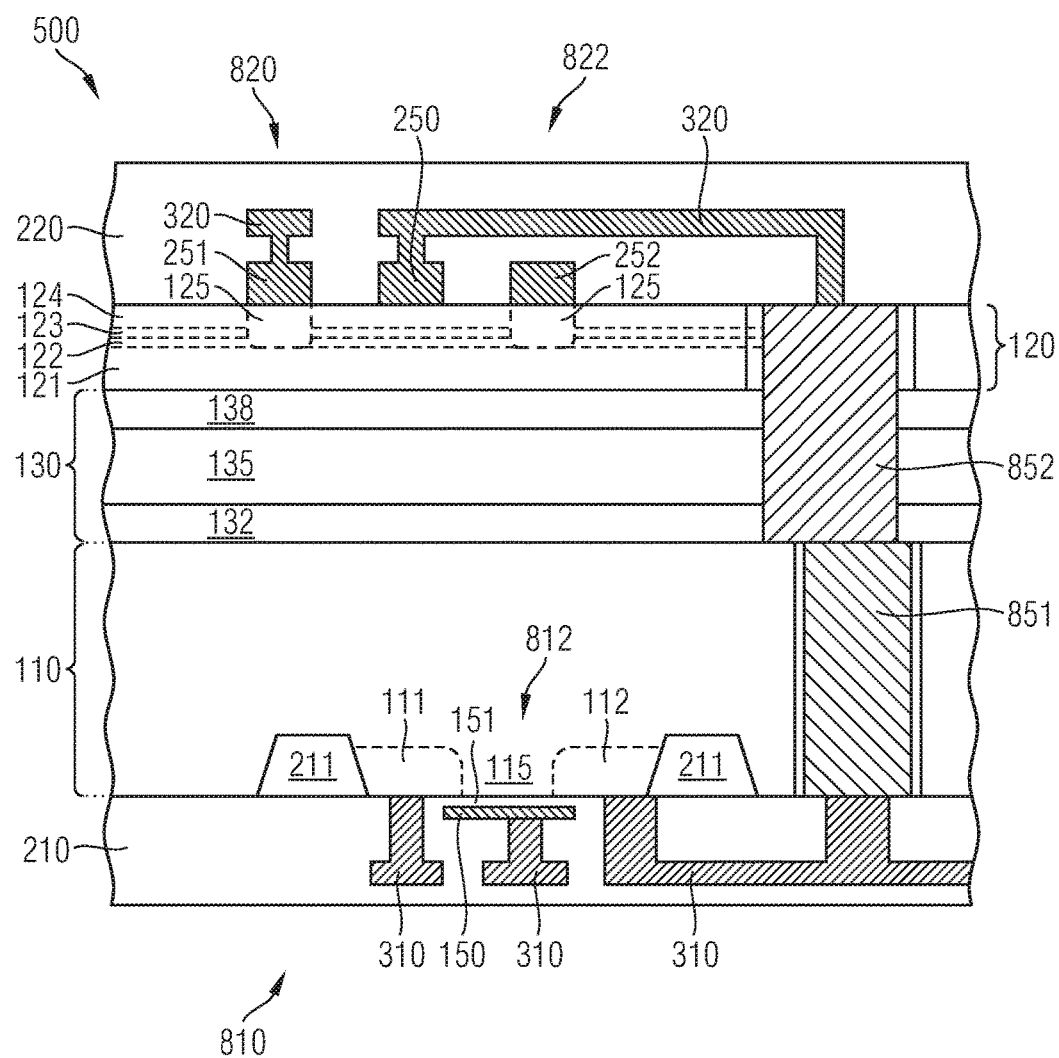

METHOD OF MANUFACTURING SEMICONDUCTOR DEVICES BY BONDING A SEMICONDUCTOR DISK ON A BASE SUBSTRATE, COMPOSITE WAFER AND SEMICONDUCTOR DEVICE

PRIORITY CLAIM

This application claims priority to German Patent Application No. 10 2015 103323.2 filed on 6 Mar. 2015, the content of said application incorporated herein by reference in its entirety.

BACKGROUND

Compound semiconductor materials such as silicon carbide and $A_{III}B_V$ semiconductor materials allow the fabrication of semiconductor devices with lower switching losses as well as improved breakdown voltage, current density, operation frequency and temperature stability compared to silicon-based power devices. Wafers of compound semiconductor materials typically have comparatively small diameters and are comparatively expensive. Therefore compound semiconductor materials are also formed by epitaxy on a cost-efficient crystalline base substrate, wherein buffer layers match the crystal lattice of the epitaxial compound semiconductor material with the crystal lattice of the base substrate.

It is desirable to manufacture semiconductor devices that are based on compound semiconductor materials at ow crystal defect density in a cost-effective manner.

SUMMARY

According to an embodiment, a method of manufacturing a semiconductor device includes attaching, by adhesion bonding, a semiconductor disk of a first crystalline material, which has a first lattice system, on a process surface of a base substrate, wherein a bonding layer is formed between the semiconductor disk and the base substrate. A second semiconductor layer of a second crystalline material with a second, different lattice system is formed by epitaxy on a first semiconductor layer formed from the semiconductor disk.

According to another embodiment, a composite wafer includes a base substrate and a first semiconductor layer from a first semiconductor material with a horizontal extension that is smaller than a horizontal extension of the base substrate. A bonding layer is sandwiched between the base substrate and the first semiconductor layer. A second semiconductor layer from a second, different semiconductor material is on a side of the first semiconductor layer opposite to the base substrate.

According to a further embodiment, a semiconductor device includes a first semiconductor section from a first semiconductor material, wherein the first semiconductor section includes at least one first electronic element. A second semiconductor section from a second semiconductor material includes a second electronic element. The first and second semiconductor sections sandwich an intermediate section. The intermediate section includes a main portion of a third semiconductor material and a bonding structure. The bonding structure is based on a ceramic and sandwiched between the main portion and the first semiconductor section.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 3A is a schematic plan view of a composite wafer according to an embodiment including a base substrate and one approximately circular second semiconductor layer formed above a process surface of the base substrate.

FIG. 5A is a schematic vertical cross-sectional view of a portion of a hybrid semiconductor device according to an embodiment concerning an insulated gate field effect transistor in a first semiconductor material electrically coupled to a high electron mobility transistor in a second semiconductor material.

DETAILED DESCRIPTION

In the following detailed description, reference is made to the accompanying drawings, which form a part hereof and in which are shown by way of illustrations specific embodiments in which the invention may be practiced. Other embodiments may be utilized and structural or logical changes may be made without departing from the scope of the present invention. For example, features illustrated or described for one embodiment can be used on or in conjunction with other embodiments to yield yet a further embodiment. The present invention may include such modifications and variations. The examples are described using specific language that should not be construed as limiting the scope of the appending claims. The drawings are not to scale and are for illustrative purposes only. For clarity, the same or similar elements have been designated by corresponding references in the different drawings if not stated otherwise.

The terms "having," "containing," "including," "comprising" and the like are open, and the terms indicate the presence of stated structures, elements or features but do not preclude additional elements or features. The articles "a," "an" and "the" may include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1H refer to the manufacture of semiconductor devices from compound semiconductor materials composed of at least two elements forming a single crystal.

Figure 1A:
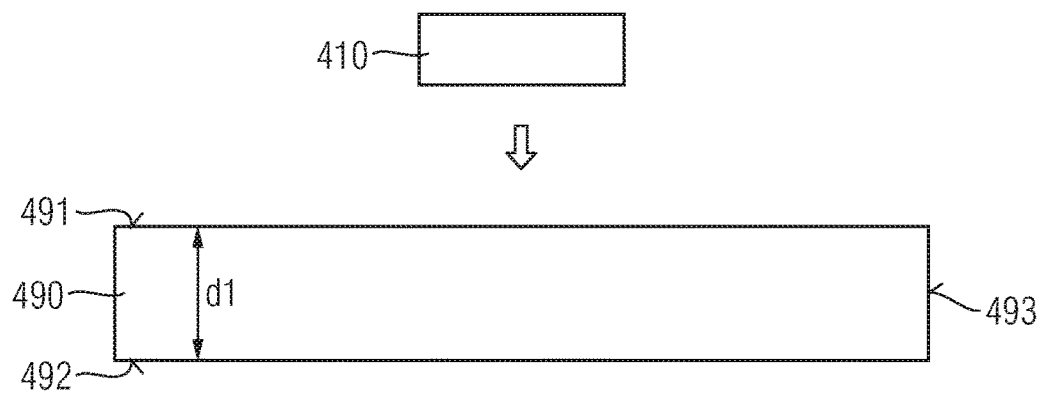
FIG. 1A is a schematic vertical cross-sectional view of a semiconductor disk and a base substrate for illustrating a method of manufacturing a semiconductor device according to an embodiment.

FIG. 1A shows a base substrate 490 and a semiconductor disk 410 which is attached onto a process surface 491 of the base substrate 490. Shape, dimensions and material of the base substrate 490 are compatible with conventional production lines for silicon-based semiconductor devices. The base substrate 490 may be formed from one single material or may include a layer stack from different materials. For example, the base substrate 490 may be a single-crystalline silicon wafer, a glass disk, for example a silicon oxide wafer or sapphire wafer, or a solid carbon disk, e.g., a graphite disk.

According to an embodiment, the base substrate 490 is a pre-processed substrate in which first electronic elements are formed along a second surface 492 opposite to a process surface 491.

The base substrate 490 may have an approximately cylindrical shape, wherein one of the two planar main surfaces forms the process surface 491. The outer surface (lateral surface) 493 of the base substrate 490 may include a flat for indicating a crystal direction. The diameter of the base substrate 490 may be at least 150 mm, e.g., 200 mm ("8 inch" wafer) or 300 mm ("12 inch" wafer). A thickness d1 of the base substrate 490 may be between 700 and 800 µm, by way of example.

A normal to the process surface 491 defines a vertical direction. Directions parallel to the process surface 491 are horizontal directions.

The semiconductor disk 410 may be a wafer or a slice of homogeneous thickness and with a horizontal extension that is smaller than the horizontal extension of the base substrate 490. The semiconductor disk 410 is composed of a first crystalline material suitable as a starting layer for the epitaxial growth of a second crystal material. For example, the material of the semiconductor disk 410 may be silicon carbide (SiC), aluminum nitride (AlN) or alumina ($Al_2O_3$).

According to an embodiment, the semiconductor disk 410 is an SiC wafer with a diameter of 50.8 mm (2 inch), 76.2 mm (3 inch), 100 mm ("4 inch") or 150 mm ("6 inch") and a thickness of 100µ, or more.

At least one semiconductor disk 410 is attached to the process surface 491 of the base substrate 490 by adhesion bonding. For example, in case the base substrate 490 is a silicon wafer or includes a silicon layer forming the process surface 491, an adhesion layer based on a preceramic polymer, e.g., polycarbosilane may be applied onto the process surface 491, a surface of the first semiconductor disk 410 facing the process surface 491 or both. Then the semiconductor disk 410 is attached to the base substrate 490. A heating treatment may harden the adhesion layer to form, from the material of the adhesion layer, a solid stable bonding layer 415 between the base substrate 490 and the semiconductor disk 410.

In case the base substrate 490 is a graphite disk the adhesion layer may be based on mesophase carbon or pitch. A heating process may convert the mesophase carbon or pitch into a graphite layer, wherein solvents and pyrolysis products of the mesophase carbon or pitch may evaporate through the open porous structure of the graphite carrier.

Figure 1B:
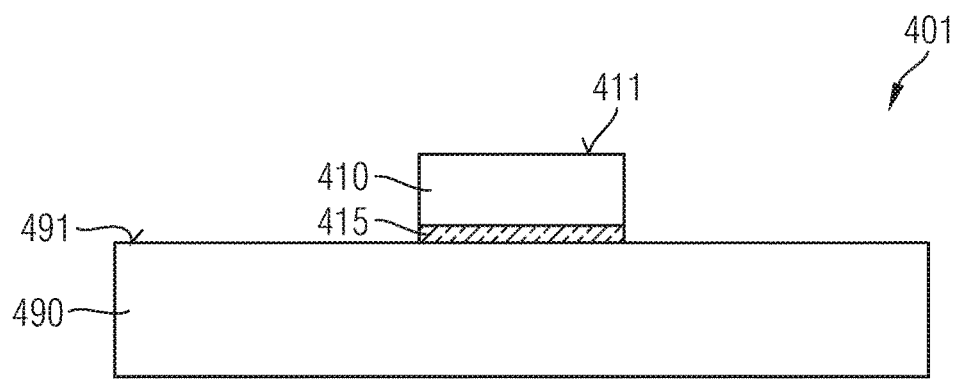
FIG. 1B is a schematic vertical cross-sectional view of the base substrate and the semiconductor disk of FIG. 1A, after attaching the semiconductor disk onto the base substrate.

FIG. 1B shows a process substrate 401 including the bonding layer 415 connecting the semiconductor disk 410 with the base substrate 490. The bonding layer 415 may consist of or may contain, as main constituent, polycrystalline silicon carbide or graphite and may have a thickness of several hundred nm, for example approximately 0.5 to 3 µm.

Since the process substrate 401 is compatible with a silicon wafer as regards dimensions and shape, the following processes may be performed within a conventional production line for silicon devices.

A thin first semiconductor layer 410a may be formed from the semiconductor disk 410 by thinning, for example by etching, polishing or delamination. According to an embodiment, impurities may be implanted through an exposed top surface 411 into the semiconductor disk 410 at a high dose. The impurities may be, for example, hydrogen ions. A narrow delamination zone 412, in which the implanted impurities damage the crystal lattice of the semiconductor disk 410, forms along the implant peak. A thermal treatment may lift off a main portion of the semiconductor disk 410 above the delamination zone 412, wherein the delamination zone 412 is effective as cleavage plane.

Figure 1C:
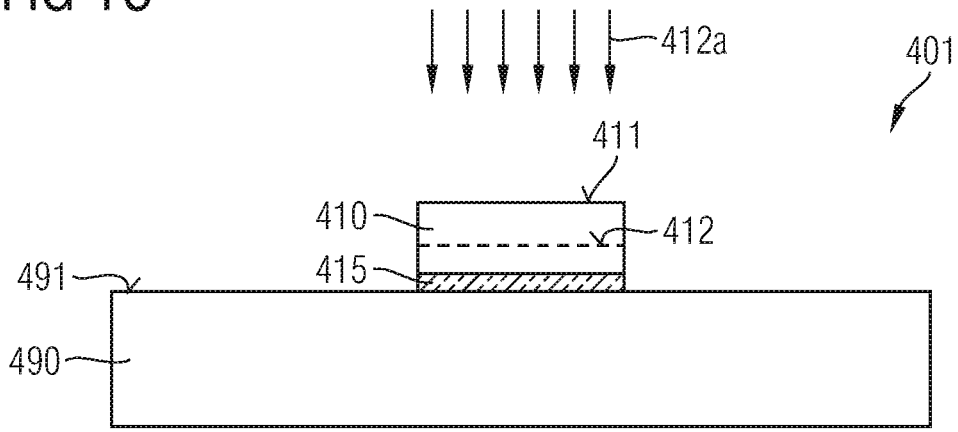
FIG. 1C is a schematic vertical cross-sectional view of the semiconductor disk and the base substrate of FIG. 1B, during formation of a delamination zone in the semiconductor disk.
Figure 1D:
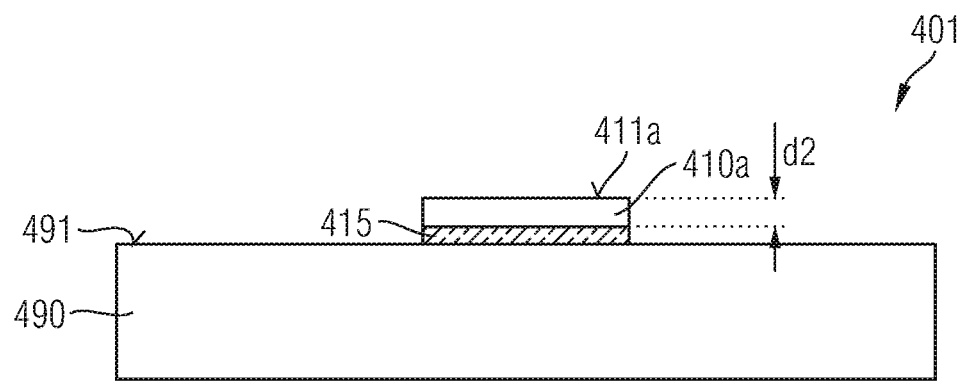
FIG. 1D is a schematic vertical cross-sectional view of the base substrate of FIG. 1C and a first semiconductor layer obtained by delaminating a portion of the semiconductor disk of FIG. 1C.

FIG. 1D shows the first semiconductor layer 410a, which is formed from a remnant portion of the semiconductor disk 410, after the delamination process of FIG. 1C. A thickness d2 of the first semiconductor disk 410a may be in a range from 2 to 50 µm, by way of example. A CTE (coefficient of thermal expansion) of the base substrate 490 may be adjusted to the CTE of the second semiconductor layer 420 or may be a value between the CTE of the first semiconductor layer 410a and the second semiconductor layer 420. In the latter case, the thickness of the first semiconductor layer 410a may be less than 10 µm to obtain an elastic first semiconductor layer 410a supporting the formation of comparatively thick second semiconductor layers 420 of bridle materials, such as gallium nitride at reduced tendency to the formation of cracks in the second semiconductor layer 420. According to other embodiments the thickness d2 is at least 500 nm, for example at least 5 µm for obtaining semiconductor devices with high breakdown voltage even at comparatively thin second semiconductor layers 420. According to an embodiment the thickness d2 of the first semiconductor layer 410a is at least 5 µm to obtain semiconductor devices based on compound semiconductor materials from 600 V to 1200 V.

The first semiconductor layer 410a of FIG. 1D or, in case the semiconductor disk 410 is not thinned, the semiconductor disk 410 may be patterned by photolithography, wherein portions of the first semiconductor layer 410a or the semiconductor disk 410 are removed and the bonding layer 415 or the base substrate 496 is exposed between remnant portions of the semiconductor layer 410a. In the following, the target semiconductor material grows only on island portions of the semiconductor layer 410a or the semiconductor disk 410.

Alternatively or in addition, the top surface 411a of the first semiconductor layer 410a may be polished, e.g., in a chemical-mechanical polishing process, or an auxiliary layer of the first crystalline material may be grown by epitaxy on the top surface 411a, or a super lattice is formed on the top surface 411a.

On the top surface 411a of the first semiconductor layer 410a of FIG. 1D or on the top surface 411 of the semiconductor disk 410 of FIG. 1B a second semiconductor layer 420 from a second crystalline material is grown by epitaxy.

Forming the second semiconductor layer 420 may include forming a buffer structure 418 or a super lattice on the first semiconductor layer 410a, wherein the buffer structure 418 may match the crystal lattice of the first semiconductor layer 410a with the crystal lattice of the target compound semiconductor material of the second semiconductor layer 420.

Figure 1E:
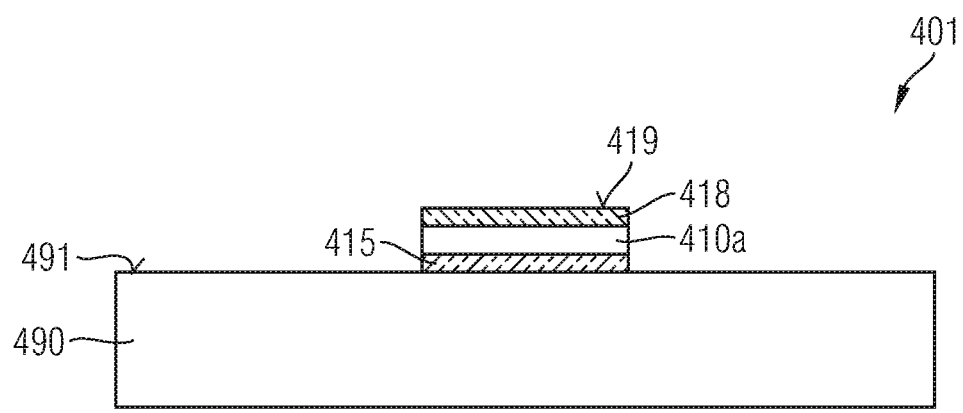
FIG. 1E is a schematic vertical cross-sectional view of the first semiconductor layer and the base substrate of FIG. 1D, after forming a buffer layer on the first semiconductor layer.

FIG. 1E shows the buffer structure 418 formed on the exposed top surface 411a of the first semiconductor layer 410a. The buffer structure 418 may consist of one homogeneous buffer layer or may include a layer stack of different materials successively matching the crystal lattice structure of the first semiconductor layer 410a with the crystal structure of the target compound semiconductor material.

The second semiconductor layer 420 from a second semiconductor material, which has a crystal lattice structure different from the crystal lattice structure of the first semiconductor material, is grown by epitaxy on the buffer structure 418. According to an embodiment, formation of the buffer structure 418 may be omitted and the second semiconductor layer 420 is directly grown on the top surface 411a of the first semiconductor layer 410a or the top surface of the semiconductor disk 410 of FIG. 1B.

Figure 1F:
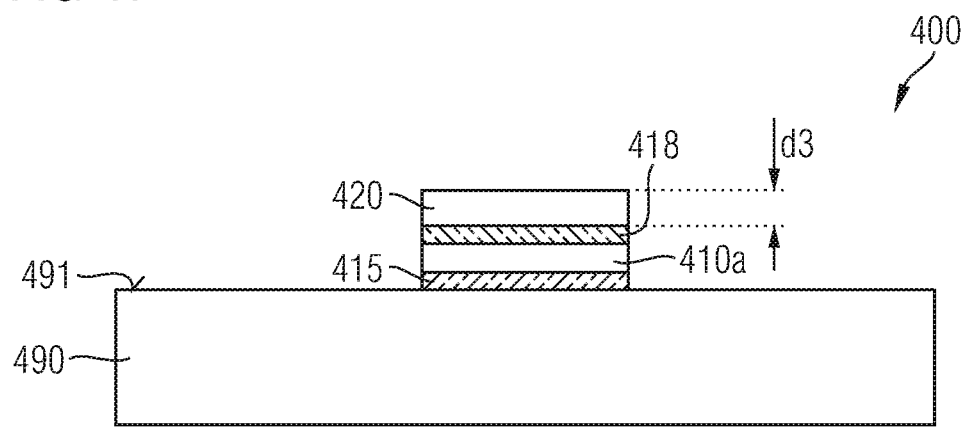
FIG. 1F is a schematic vertical cross-sectional view of a composite wafer obtained from the first semiconductor layer and the base substrate of FIG. 1E by growing by epitaxy a second semiconductor layer on the buffer layer.

FIG. 1F shows the second semiconductor layer 420 grown on the buffer structure 418. The material of the second semiconductor layer 420 may contain other elements than the first semiconductor layer 410a. For example, the material of the first semiconductor layer 410a may be silicon carbide and the material of the second semiconductor layer 420 may be gallium arsenide or gallium nitride, by way of example. A thickness d3 of the second semiconductor layer 420 may in a range from 0.5 µm to 10 µm, for example in a range from 2 µm to 6 µm.

The base substrate 490 with the second semiconductor layer 420 formed thereon forms a composite wafer 400. Electronic elements 821 are formed in the second semiconductor layer 420, wherein due to its shape, dimensions and materials, the composite wafer 400 can be processed in conventional production lines for silicon devices in the same way as silicon wafers. Manufacturing of semiconductor devices based on or including components on the basis of gallium nitride and gallium arsenide requires no adaptation of existing tools in a state-of-the-art silicon production line. Compared to approaches manufacturing GaN and GaAs semiconductor devices on the basis of GaN or GaAs wafers with small diameter, more semiconductor devices can be obtained from each processed wafer. Other than conventional GaN-on-Si approaches where compound semiconductor materials such as GaN are grown directly on silicon wafers, the first semiconductor layer 410a decouples the crystal lattice of the base substrate 490 from the crystal lattice of the second semiconductor material of the second semiconductor layer 420. For example, a first semiconductor layer 410a of silicon carbide has a crystal lattice that matches better the crystal lattice of compound semiconductor materials such as GaN and GaAs than silicon. As a result, gallium nitride layers grown on the SiC basis are exposed to less mechanical stress and grow at lower crystal lattice defect density. Mechanical strain induced by the epitaxial layers into the base substrate 490 is lower than when directly grown on the base substrate 490. Wafer bowing can be reduced even when the base substrate 490 has a comparatively great diameter of, e.g., 200 µm.

The base substrate 490 may be completely removed, for example by dry etching using an $SF_6$-based dry etch. In addition, the bonding layer 415, the bonding layer 415 and the first semiconductor layer 410a, or the bonding layer 415, the first semiconductor layer 410a and at least a portion of the buffer structure 418 may be removed by suitable etching and/or polishing processes.

Figure 1G:
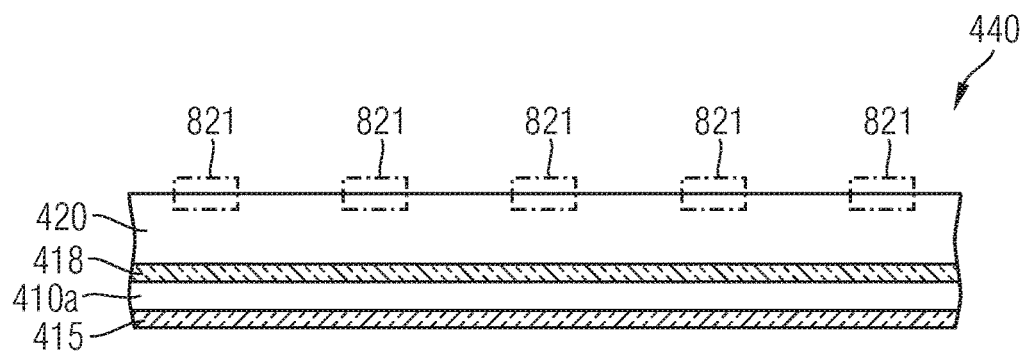
FIG. 1G is a schematic vertical cross-sectional view of an intermediate substrate obtained from the composite wafer of FIG. 1F by removing the base substrate.

FIG. 1G shows an auxiliary wafer 440 including the first and second semiconductor layers 410a, 420 after formation of electronic elements 821 in the second semiconductor layer 420 and after removal of the base substrate 490.

The auxiliary wafer 440 may be cut, sawn or broken along perforation lines to obtain semiconductor devices 500 based on the crystalline compound semiconductor material of the second semiconductor layer 420.

Figure 1H:
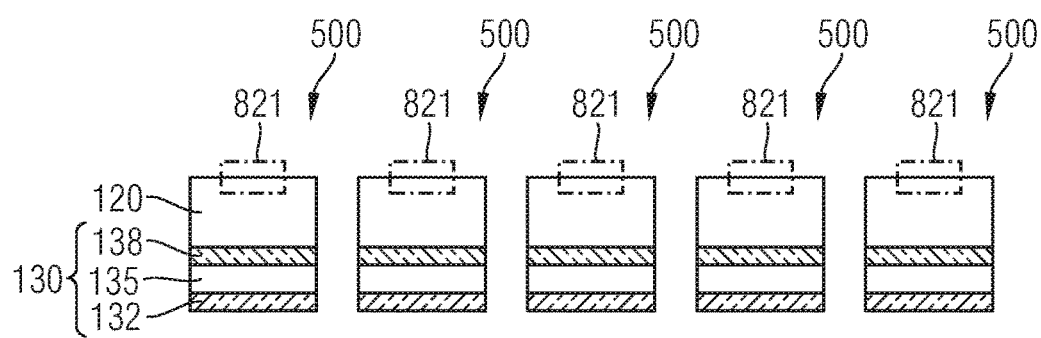
FIG. 1H schematically shows a plurality of semiconductor devices obtained from the intermediate substrate of FIG. 1G.

FIG. 1H shows a plurality of semiconductor devices 500 with approximately identical characteristics obtained from the auxiliary wafer 440 of FIG. 1H. Each semiconductor device 500 may include a semiconductor section 120 from a compound semiconductor material with a large band gap and including electronic elements 821 formed at a front side.

On the back, the semiconductor device 500 may include an intermediate section 130 directly adjoining the first semiconductor section 120. The intermediate section 130 may include a buffer structure 138 directly adjoining the semiconductor section 120. A main portion 135 may directly adjoin the buffer structure 138. A bonding structure 132 may directly adjoin the main portion 135. The main portion 135 may include or consist of crystalline silicon carbide. The bonding structure 132 may consist of or include, as main constituent, polycrystalline silicon carbide. The buffer structure 138 may include one or more layers of a compound semiconductor including the elements forming the second semiconductor section 120, for example AlGaAs, InGaAs, or AlGaN. The intermediate section may have a total thickness of 5 to 10 µm such that semiconductor devices formed in the semiconductor section 120 may have a high blocking capability even for thin semiconductor sections 120. In addition, parasitic capacities of the electronic elements 821 may be reduced by increasing thickness of the intermediate section 130.

Figure 2A:
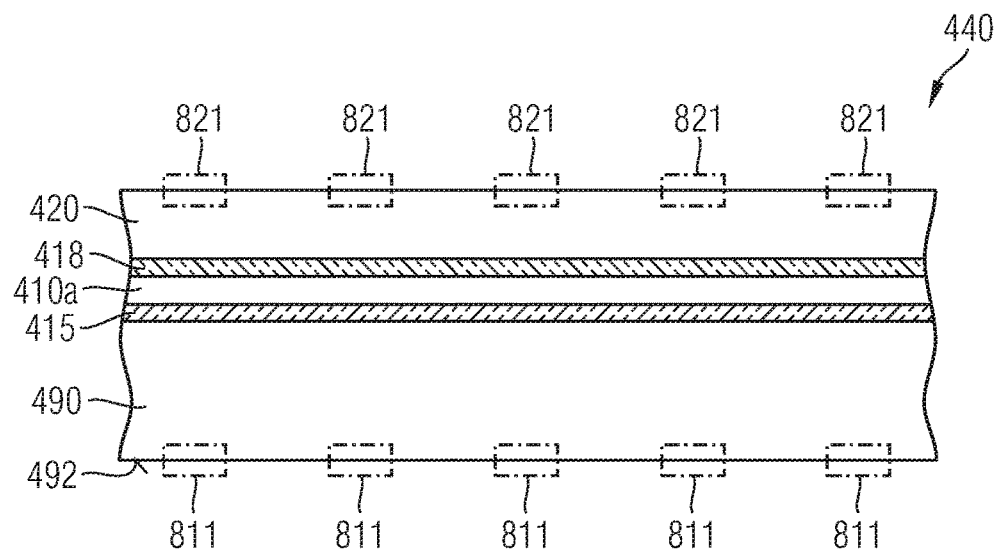
FIG. 2A is a schematic vertical cross-sectional view of a composite wafer according to an embodiment concerning a base substrate with first electronic elements, after forming second electronic elements in the second semiconductor layer.

FIG. 2A shows an auxiliary wafer 440 with a base substrate 490 including first electronic elements 811, wherein the first electronic elements 811 are formed in the base substrate 490 along the second surface 492 before the semiconductor disk 410 is bonded onto the process surface 491 of the base substrate 490.

For example, the base substrate 490 is a silicon wafer, the first semiconductor layer 410a is a silicon carbide wafer and the second semiconductor layer 420 is based on gallium nitride or gallium arsenide. Typical processes for forming the composite wafer 440 on the basis of the pre-processed base substrate 490 including the first electronic elements 811 and processes for forming the second electronic elements 821 in the second semiconductor layer 420 use temperature ranges which do not adversely affect the first electronic elements 811.

After formation of the second electronic elements 821 in the second semiconductor layer 420 the composite wafer 400 may be sawn, cut or broken along perforation lines to obtain a plurality of hybrid semiconductor devices 500 with approximately identical characteristics. Each hybrid semiconductor device 500 includes an intermediate section 130 sandwiched between a first semiconductor section 110 and a second semiconductor section 120. Electronic elements 811, 821 formed in the first and second semiconductor sections 110, 120 are based on different semiconductor materials, e.g., gallium nitride or gallium arsenide in the second semiconductor section 120 and silicon in the first semiconductor section 110.

FIGS. 3A to 3D show embodiments of a composite wafer 400 obtained by epitaxial growth of a second semiconductor material on a first semiconductor material bonded onto a base substrate which is compatible with production lines for semiconductor devices based on silicon.

The composite wafer 400 of FIG. 3A includes a base substrate 490, a second semiconductor layer 420 and a first semiconductor layer 410a arranged between the base substrate 490 and the second semiconductor layer 420 in the vertical projection of the second semiconductor layer 420.

The base substrate 490 may be a disk or wafer from one or more materials compatible with silicon technology, for example a carbon disk, a silicon wafer, a silicon-on-insulator wafer, or a glass disk with a diameter of 200 mm, 300 mm or 450 mm. The base substrate 490 has an approximately cylindrical shape, wherein the outer surface 493 of the cylinder may have a flat portion 494 indicating a crystal orientation in the base substrate 490. One of the two parallel main surfaces of the base substrate 490 forms a process surface 491.

The first semiconductor layer 410a may be a slice obtained from a wafer of a first compound semiconductor material, wherein a crystal lattice structure of the first compound semiconductor material deviates to a lower degree from a crystal lattice of a second compound semiconductor material than a crystal lattice of the base substrate 490. The first semiconductor layer 410a has a uniform thickness and may have an approximately cylindrical shape, wherein the main surfaces of the first semiconductor layer 410a are parallel to the process surface 491 of the base substrate 490. A ceramic bonding layer connects the first semiconductor layer 410a and the base substrate 490.

The first semiconductor layer 410a may have an arbitrary shape. According to the illustrated embodiment, the first semiconductor layer 410a is a thinned wafer with a smaller diameter than the base substrate 490. For example, the diameter of the first semiconductor layer 410a is 50.8 mm (2 inch), 76.2 mm (4 inch), 100 mm, or 150 mm, by way of example. An outer surface 413 of the first semiconductor layer 410a may include one or more flats 414. The first semiconductor layer 410a may be arranged such that the cylinder axis coincides with the cylinder axis of the base substrate 490. The second semiconductor layer 420 is formed in the vertical projection of the first semiconductor layer 410a and may have the same shape and horizontal dimensions as the first semiconductor layer 410a.

Figure 3B:
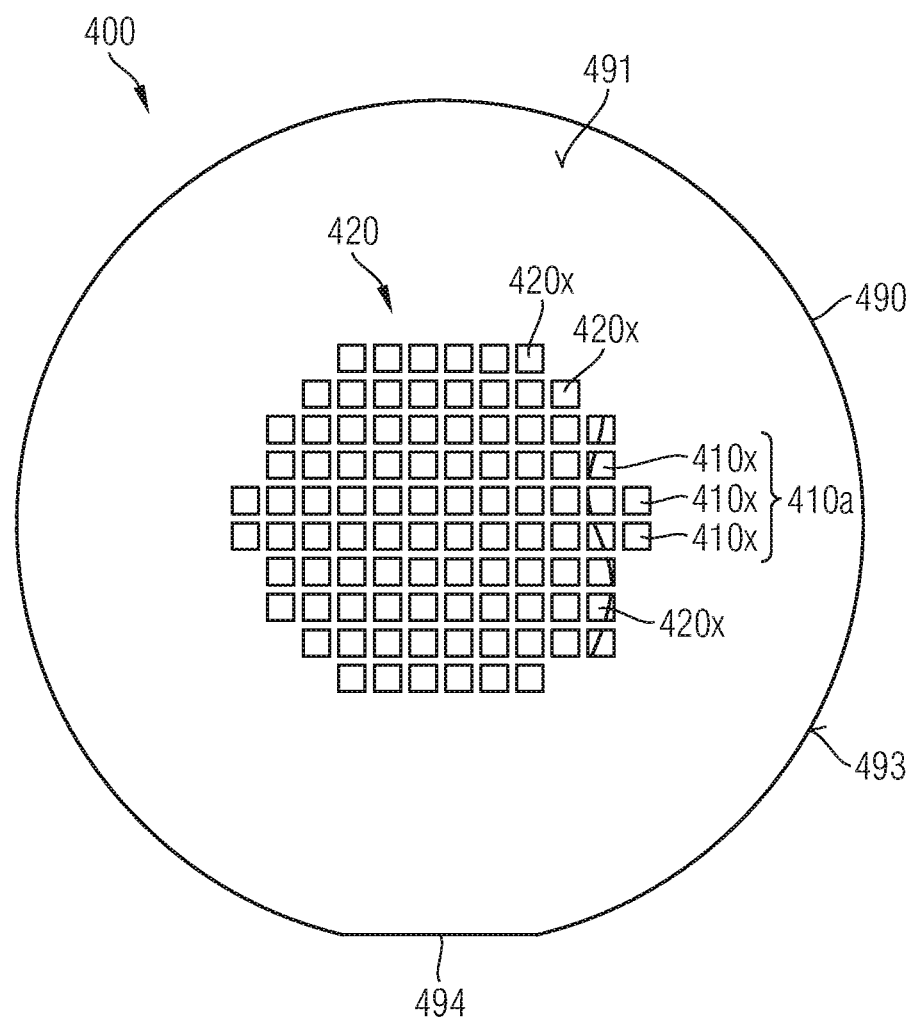
FIG. 3B is a schematic plan view of a composite wafer according to an embodiment including a base substrate and a second semiconductor layer including a plurality of isolated islands.

In FIG. 3B the composite wafer 400 results from patterning the first semiconductor layer 410a of FIG. 3A prior to forming the second semiconductor layer 420. For example, the first semiconductor layer 410a is formed from a slice of a silicon carbide wafer with a diameter smaller than the diameter of the base substrate 490 and is patterned by photolithography such that the first semiconductor layer 410a includes a plurality of first islands 410x. Grooves between the first islands 410x may expose the process surface 491 of the base substrate 490. According to another embodiment, a fill material may fill the grooves between the first islands 410x and may cover the process surface 491 with a thickness corresponding to the height of the first islands 410x. As a result, the second semiconductor layer 420 includes isolated portions 420x with the same shape and horizontal dimensions as the first islands 410x. Grooves between the isolated portions 420x may form perforation lines along which the composite semiconductor device 400 is broken or sawn to obtain a plurality of semiconductor devices formed in the isolated portions 420x.

Figure 3C:
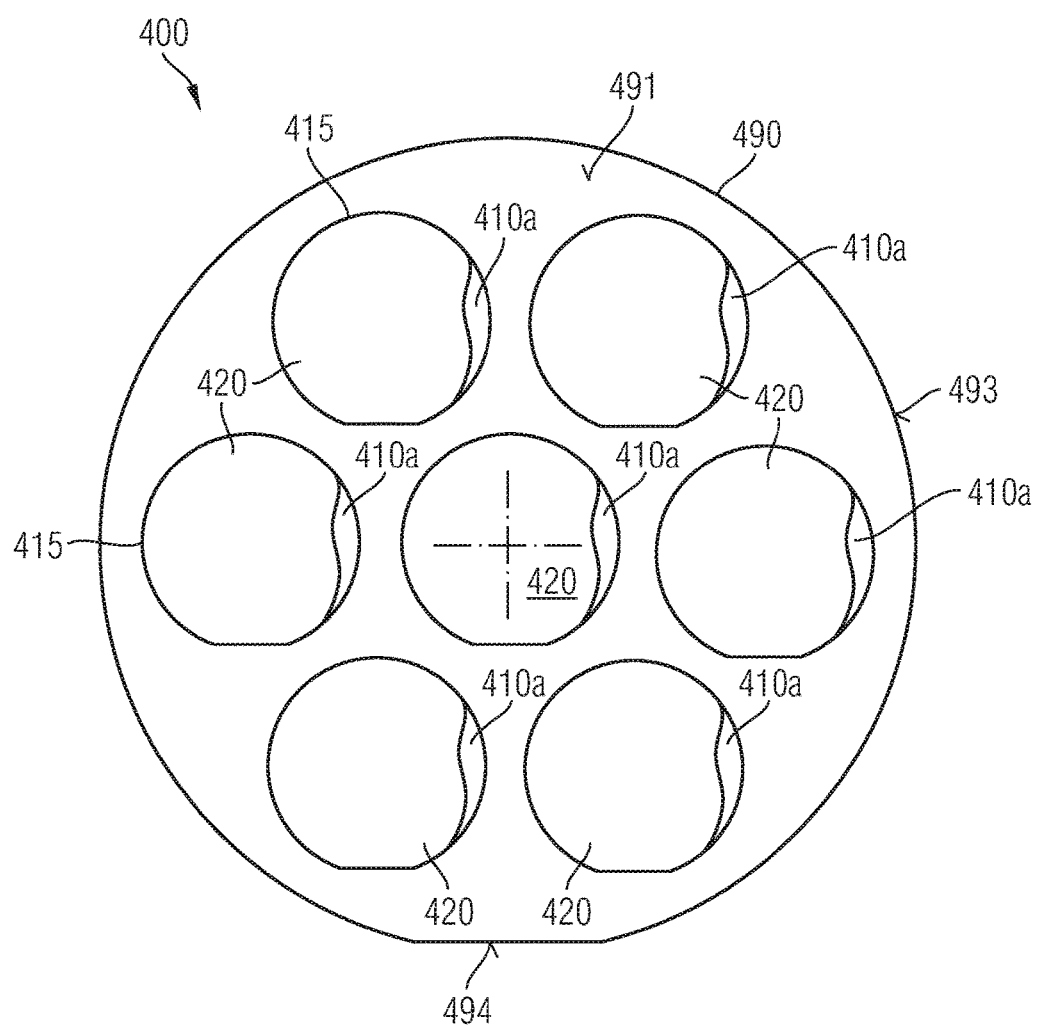
FIG. 3C is a schematic plan view of a composite wafer according to an embodiment including a base substrate and a plurality of isolated, approximately circular columns with first and second semiconductor layers, respectively.

The semiconductor layers 410a, 420 in FIG. 3C result from a plurality of semiconductor disks attached side-by-side onto the process surface 491 of the base substrate 490. For example, the semiconductor disks are slices of silicon carbide wafers with a diameter of less than 100 mm, for example 50.8 mm. Remnant portions of the first semiconductor layer 410a and the second semiconductor layer 420 form isolated columns 415 with the shape of the semiconductor disks.

Figure 3D:
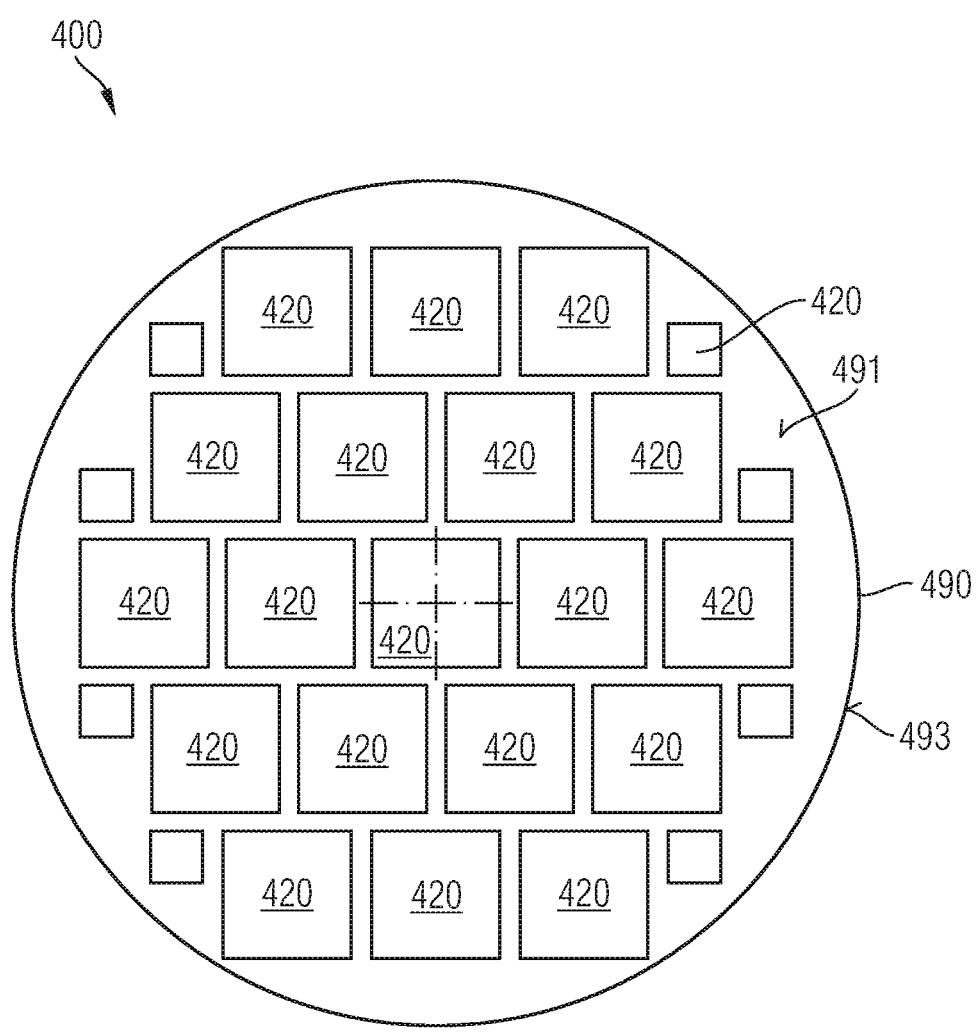
FIG. 3D is a schematic plan view of a composite wafer according to an embodiment including a base substrate and a plurality of isolated, rectangular columns with first and second semiconductor layers, respectively.

FIG. 3D shows a composite wafer 400 with a second semiconductor layer 420 comprising portions obtained from a plurality of isolated portions of the first semiconductor layers 410a, for example rectangular or square slices of silicon carbide. The rectangular slices may be obtained by cutting silicon carbide wafers. Slices of different size and shape may be combined to increase area efficiency.

Figure 2B:
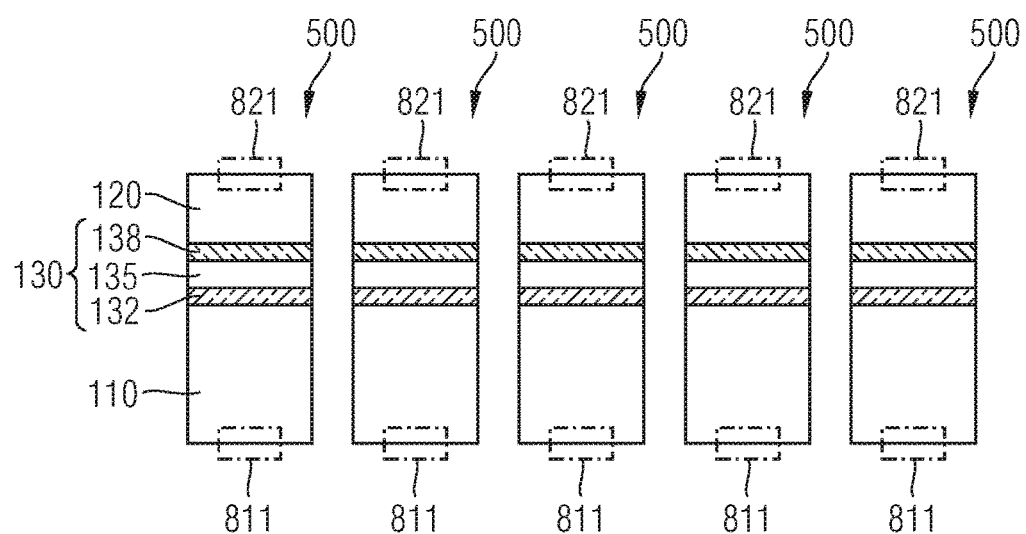
FIG. 2B schematically shows a plurality of hybrid semiconductor devices obtained from the composite wafer of FIG. 2A.
Figure 4:
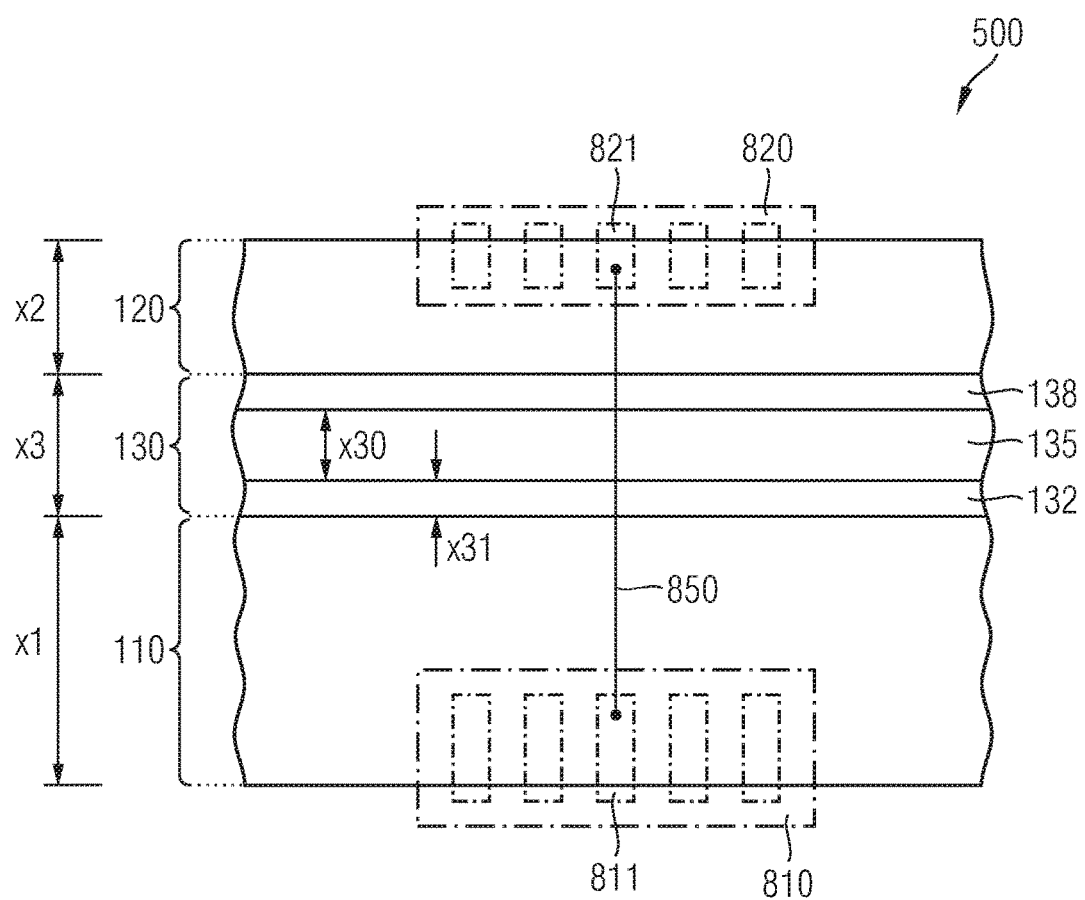
FIG. 4 is a schematic vertical cross-sectional view of a portion of a hybrid semiconductor device according to an embodiment related to a first electronic element and a second electronic element in different semiconductor sections of different semiconductor materials.

FIG. 4 shows a hybrid semiconductor device 500 obtained by using a method as described with reference to FIGS. 1A to 1F in combination with FIGS. 2A to 2B. The hybrid semiconductor device 500 includes a first semiconductor section 110 from a first semiconductor material and a second semiconductor section 120 from a second semiconductor material, wherein the first semiconductor material is composed from other elements than the second semiconductor material. The first and second semiconductor materials differ as regards the lattice structure and may differ significantly as regards the band gap. A significant difference in band gap is at least 0.2 eV.

The first semiconductor section 110 includes at least one first electronic element 811, which may be a semiconductor diode, a BJT (bipolar junction transistor), a JFET (junction field effect transistor) or an IGFET (Insulated gate field effect transistor), for example an MOSFET (metal oxide semiconductor field effect transistor) in the usual meaning including field effect transistors with a metal gate and with non-metal gate. The first electronic elements 811 may be coupled to each other to form a first electronic circuit 810, for example a logic circuit, a driver circuit, a sensor circuit or a communication interface circuit. The first semiconductor material may be single crystalline silicon, by way of example.

A vertical extension x1 of the first semiconductor section 110 may be in a range from 40 µm to 750 µm, for example, from 60 µm to 350 µm.

The second semiconductor section 120 includes at least one second electronic element 821, which may be a semiconductor diode, a JFET, an BJT, an IGFET, an LED (light emitting diode), a laser diode, an opto-coupler or a HEMT (high electron mobility transistor). The second semiconductor material may be GaAs or GaN, by way of example. A plurality of second electronic elements 821 may form a second electronic circuit 820, which may be a driver circuit, a high frequency circuit, for example a receiver or transmitter for radio frequency signals, or an opto-electronic circuit, for example an opto-coupler, an opto-electronic interface or a light source.

A vertical extension x2 of the second semiconductor section 120 may be in a range from 0.5 µm to 12 µm, for example, from 2 µm to 6 µm.

An intermediate section 130 is sandwiched between the first and second semiconductor sections 110, 120. The intermediate section 130 includes a main portion 135 from a third crystalline semiconductor material which is different from the first and the second semiconductor materials 110, 120. A vertical extension x3 of the intermediate section 130 may be in a range from 0.2 µm to 25 µm, for example, from 0.5 µm to 2 µm.

The third semiconductor material has a lattice structure that deviates less from the lattice structure of the second semiconductor material 120 than the lattice structure of the first semiconductor material 110. According to an embodiment, the main portion 135 is a crystalline semiconductor carbide layer, for example an SiC layer of the fourth or sixth polytype (4H—SiC, 6H—SiC). The main portion 135 may contain dopants of the n or p type or may be intrinsic. A vertical extension x30 of the main layer portion 135 may be in a range from 100 nm to 20 µm.

A bonding structure 132 connects the main portion 135 with the first semiconductor section 110. The bonding structure 132 includes, as main constituent, a dielectric ceramic.

According to an embodiment, the bonding structure 132 is formed from polycrystalline silicon carbide resulting from hardening a polycarbonsilane layer. A vertical extension x31 of the bonding structure 132 may be in a range from 20 nm to 150 nm, for example in a range from 60 nm to 80 nm.

A buffer structure 138 may be sandwiched between the second semiconductor section 120 and the main portion 135. The buffer structure 138 may consist of one single layer or may include a layer stack of different materials, wherein the crystal lattice structure of the buffer structure 138 relaxes the difference in crystal lattice structure between the main portion 135 and the second semiconductor section 120. For example, the buffer structure 138 may include layers containing the elements of the second semiconductor section 120.

The hybrid semiconductor device 500 further includes at least one physical connection 850 electrically coupling one of the first electronic elements 811 with at least one of the second electronic elements 821. The coupling may be an ohmic coupling, a capacitive coupling, an inductive coupling or an RF coupling. According to an embodiment, the physical connection 850 is a low-ohmic coupling and includes vias extending through the intermediate section 130, the first semiconductor section 110, and the second semiconductor section 120.

The hybrid semiconductor device 500 of FIG. 5A is based on the semiconductor device 500 of FIG. 4, wherein the first semiconductor material of the first semiconductor section 110 is crystalline silicon and the second semiconductor material of the second semiconductor section 120 is crystalline gallium nitride or crystalline gallium arsenide.

A first electronic circuit 810 formed in the first semiconductor section 110 includes a control transistor 812. Source zones 111 and drain zones 112 of the control transistor 812 are doped regions within the first semiconductor layer 110. A body zone 115 of the opposite conductivity type separates the source and drain zones 111, 112. A gate dielectric 151 capacitively couples a channel portion of the body zone 115 to a gate electrode 150 such that when a potential at the gate electrode 150 exceeds or falls below a predefined threshold, minority charge carriers accumulate in the channel portion of the body zone 115 along the gate dielectric 151 and form an inversion channel allowing a unipolar charge carrier flow between the source and drain zones 111, 112. Shallow trench isolations 211 may isolate the control transistor 812 from further electronic elements in the first semiconductor section 110. A first interlayer dielectric 210 is formed on a side of the first semiconductor section 110 opposite to the intermediate section 130. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example. The interlayer dielectric 210 may embed wiring connections 310 electrically connected to the source zone 111, the gate electrode 150 and the drain zone 112.

The second semiconductor section 120 may include a substrate portion 121 directly adjoining the intermediate section 130. The substrate portion 121 may be an unalloyed semiconductor which may be intrinsic or weakly p-doped, for example p-GaAs or p-GaN. An undoped channel portion 122 may directly adjoin the substrate portion 121. The channel portion 122 may be based on an undoped narrow gap semiconductor, for example InGaAs or InGaN. A spacer portion 123 directly adjoins the channel portion 122 opposite to the substrate portion 121. The spacer portion 123 may be a wide gap semiconductor, for example AlGaAs or AlGaN. The spacer portion 123 may separate the channel portion 122 from a supplier portion 124, which may be an n-doped wide gap semiconductor, for example AlGaAs or AlGaN. The supplier portion 124 separates a HEMT gate 250 of a HEMT 822 from the spacer and channel portions 123, 122. Heavily doped contact zones 125 electrically connect the channel portion 122 with the HEMT source 251 and HEMT drain electrodes 252. A second interlayer dielectric 220 embeds wiring connections 320 of the HEMT 822 and may include one or more dielectric layers from silicon oxide, silicon nitride, silicon oxynitride, doped or undoped silicate glass, for example BSG, PSG or BPSG, by way of example.

A physical connection 850 electrically connects one of the electrodes of the control transistor 812 with one of the electrodes of the HEMT 822, for example the source or drain contact of the control transistor 812 with the HEMT gate 250. The physical connection 850 may include a first via portion 851 through the first semiconductor section 110, wherein the first via portion 851 is electrically insulated against conductive portions of the first semiconductor section 110. A second via portion 852 may extend through the second semiconductor layer 120 and the intermediate section 130. The second via portion 852 may be electrically insulated at least against the semiconductor material of the first semiconductor section 110. A second electronic circuit 820 including the HEMT 822 may be a driver stage for a switched power supply, or a half bridge or full bridge circuit for driving a motor or a driver circuit for inductive loads, by way of example.

Figure 5B:
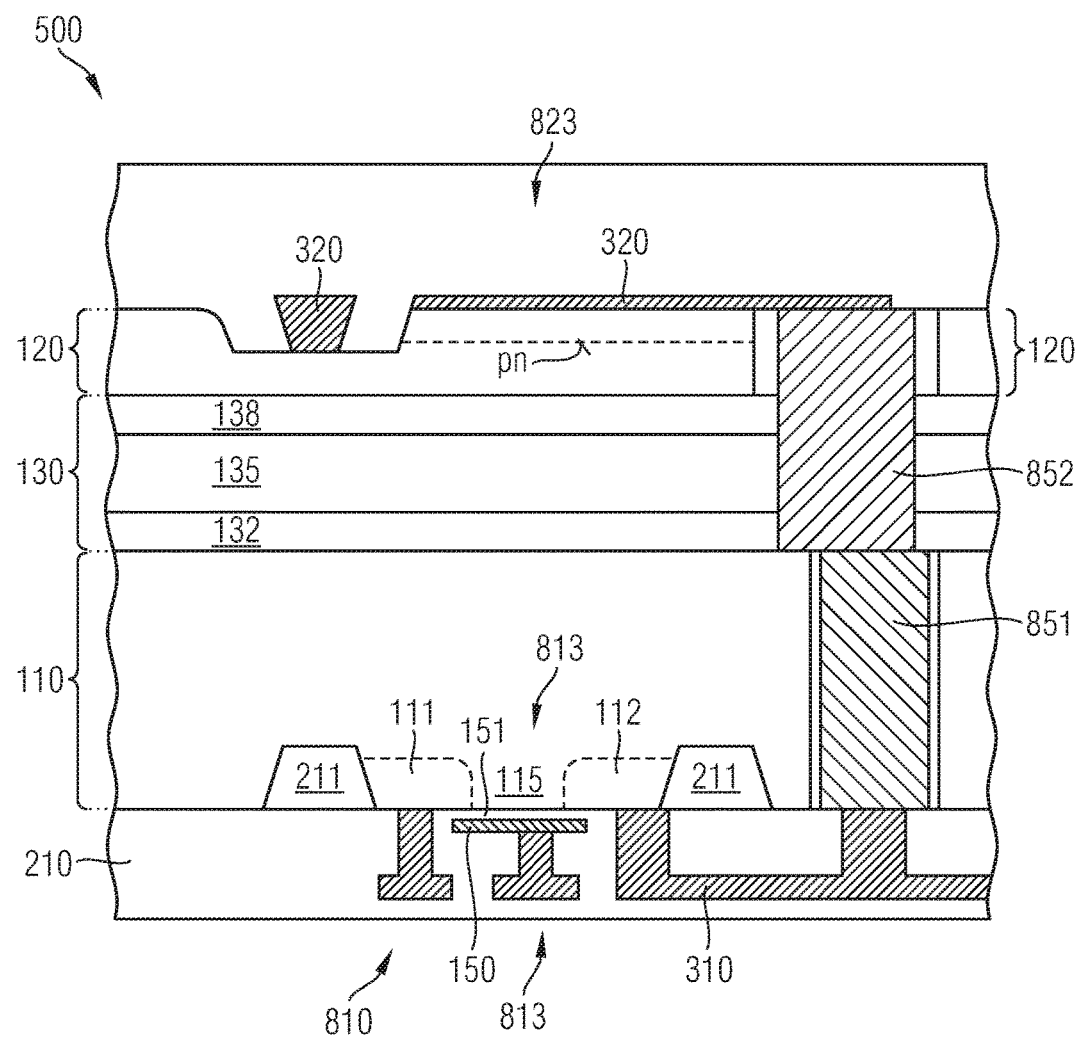
FIG. 5B is a schematic vertical cross-sectional view of a portion of a hybrid semiconductor device in accordance with an embodiment concerning an insulated gate field effect transistor in a first semiconductor material and an optoelectronic element in a second semiconductor material.

The hybrid semiconductor device 500 of FIG. 5B includes a second semiconductor section 120 of gallium nitride. An LED 823 with an active pn junction pn is formed in the second semiconductor section 120. One of the electrodes of the LED 823 is electrically connected to a driver circuit 813 formed in the first semiconductor section 110. The first electronic circuit 810 may supply the LED 823 from a 230 VAC source, by way of example. For further details, reference is made to the description of the other FIGs.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method of manufacturing semiconductor devices, the method comprising:
attaching, by adhesion bonding, a semiconductor disk of a first crystalline material on a process surface of a base substrate, wherein the first crystalline material has a first lattice system and wherein a bonding layer is formed between the semiconductor disk and the base substrate; and
forming by epitaxy a second semiconductor layer of a second crystalline material with a second, different lattice system on a first semiconductor layer formed from the semiconductor disk,
wherein the attaching, by adhesion bonding uses ceramic-forming polymers and the bonding layer includes a ceramic as main constituent.

2. The method of claim 1, wherein
the base substrate has a diameter of at least 200 mm.

3. The method of claim 1, wherein
the base substrate is selected from a group comprising a graphite disk and a silicon wafer.

4. The method of claim 1, wherein
the first crystalline material is selected from a group comprising silicon carbide, alumina, and aluminium nitride.

5. The method of claim 1, wherein
the second crystalline material is selected from a group comprising gallium nitride and gallium arsenide.

6. The method of claim 1, wherein
forming the second semiconductor layer comprises forming a buffer structure directly on the first semiconductor layer and growing by epitaxy the second semiconductor layer on the buffer structure.

7. The method of claim 1, wherein
the ceramic is based on polycrystalline silicon carbide.

8. The method of claim 1, wherein
a plurality of semiconductor disks are attached side-by-side on the process surface of the base substrate.

9. The method of claim 1, further comprising:
removing, before forming the second semiconductor layer, portions of the first semiconductor layer, wherein portions of the bonding layer or the base substrate are exposed.

10. The method of claim 1, further comprising:
thinning, by delamination, the semiconductor disk to form the first semiconductor layer from the semiconductor disk.

11. The method of claim 1, wherein, prior to the attaching, by adhesion bonding, the semiconductor disk of a first crystalline material and the base substrate are provided as discrete structures, and wherein the attaching, by adhesion bonding comprises:
initially applying an adhesion layer to the process surface of the base substrate or a surface of the semiconductor disk; and
subsequently attaching the semiconductor disk to the base substrate with the adhesion layer being disposed between the semiconductor disk and the base substrate.

12. The method of claim 1, wherein the bonding layer is initially applied to the process surface of the base substrate.

* * * * *